(12) United States Patent
Li et al.

(10) Patent No.: US 10,914,943 B2
(45) Date of Patent: Feb. 9, 2021

(54) NON-GHOSTING IMAGING DEVICE

(71) Applicant: TRIPLE WIN TECHNOLOGY(SHENZHEN) CO. LTD., Shenzhen (CN)

(72) Inventors: Shuai-Peng Li, Shenzhen (CN); Shin-Wen Chen, New Taipei (TW); Kun Li, Shenzhen (CN); Long-Fei Zhang, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 161 days.

(21) Appl. No.: 16/231,996

(22) Filed: Dec. 25, 2018

(65) Prior Publication Data
US 2020/0004012 A1 Jan. 2, 2020

(30) Foreign Application Priority Data
Jun. 29, 2018 (CN) .................... 2018 2 1050823 U

(51) Int. Cl.
*H05K 1/18* (2006.01)
*G02B 27/00* (2006.01)
*H05K 1/02* (2006.01)
*H04N 5/225* (2006.01)

(52) U.S. Cl.
CPC ....... *G02B 27/0018* (2013.01); *H04N 5/2253* (2013.01); *H04N 5/2254* (2013.01); *H05K 1/0203* (2013.01); *H05K 1/0274* (2013.01); *H05K 1/181* (2013.01); *H05K 2201/10121* (2013.01); *H05K 2201/10151* (2013.01)

(58) Field of Classification Search
CPC ....... H04N 5/2252–2257; H04N 5/225; H04N 5/247; H01L 27/146; H01L 27/4618; H01L 27/4636; H05K 1/183; H05K 1/0274; G02B 7/02–708
USPC .......... 361/775–784, 803; 439/67, 108, 607; 348/335, 340, 374
See application file for complete search history.

(56) References Cited

U.S. PATENT DOCUMENTS

| | | | |
|---|---|---|---|
| 7,166,907 B2 * | 1/2007 | Onishi | H01L 27/14618 257/434 |
| 7,428,111 B2 * | 9/2008 | Shibata | H04N 5/2254 348/E5.028 |
| 7,530,748 B2 * | 5/2009 | Shibata | G02B 13/001 359/808 |
| 7,609,461 B1 * | 10/2009 | Webster | G02B 7/02 359/811 |
| 8,976,291 B2 * | 3/2015 | Chen | H04N 5/2257 348/374 |
| 2004/0094825 A1 * | 5/2004 | Onishi | H01L 27/14625 257/666 |

(Continued)

*Primary Examiner* — Tuan T Dinh
(74) *Attorney, Agent, or Firm* — ScienBiziP, P.C.

(57) ABSTRACT

A camera device with anti-ghosting and anti-flare properties includes a printed circuit board; an image sensor mounted on the printed circuit board; and a supporting bracket fixed on the printed circuit board. The supporting bracket includes a supporting plate and perpendicular side wall. The supporting plate and the side wall together form a receiving room covering the image sensor, the supporting plate is opened to form a step portion. The step portion comprises a matte top bearing surface, and a protecting sheet fixed on the matte top bearing surface.

12 Claims, 6 Drawing Sheets

(56) References Cited

U.S. PATENT DOCUMENTS

| | | | |
|---|---|---|---|
| 2011/0286732 A1* | 11/2011 | Hosokawa | G03B 17/02 |
| | | | 396/55 |
| 2012/0229701 A1* | 9/2012 | Pavithran | H04N 5/2252 |
| | | | 348/374 |
| 2012/0257075 A1* | 10/2012 | Kamada | H01L 27/14618 |
| | | | 348/222.1 |
| 2013/0148016 A1* | 6/2013 | Oh | H04N 5/2253 |
| | | | 348/374 |
| 2014/0184902 A1* | 7/2014 | Chen | H04N 5/2257 |
| | | | 348/374 |
| 2015/0229843 A1* | 8/2015 | Shimizu | H04N 5/23248 |
| | | | 348/222.1 |
| 2017/0139225 A1* | 5/2017 | Lim | G02B 27/646 |
| 2017/0155807 A1* | 6/2017 | Zhang | H01L 27/14636 |
| 2017/0310860 A1* | 10/2017 | Wang | H01L 27/14618 |

* cited by examiner

NON-GHOSTING IMAGING DEVICE

FIELD

The subject matter herein generally relates to imaging.

BACKGROUND

Camera modules are widespread in electronic devices, such as digital cameras and mobile phones. A camera module usually includes a lens bracket and a lens module fixed on the lens bracket. During image capturing by the camera module, a portion of light on the lens module can be reflected by the lens bracket before reaching the image sensor of the camera module, thus forming a ghost or flare and degrading the quality of the captured image.

Therefore, there is room for improvement within the art.

SUMMARY OF INVENTION

The present application provides a camera device, which includes a printed circuit board, an image sensor, a supporting bracket, a protecting sheet, and a lens module. The image sensor is mounted on the printed circuit board. The supporting bracket is fixed on the printed circuit board, and the supporting bracket includes a supporting plate and a side wall perpendicularly to the supporting plate. The supporting plate and the side wall together forming a receiving room for covering the image sensor, and the supporting plate is opened to form a step portion, the step portion includes a top bearing surface with a matte surface. The protecting sheet is fixed on the top bearing surface. The lens module fixed on the supporting bracket by a viscous colloid, the viscous colloid being solidified to form a barricade, the barricade preventing light from leaking via a gap between the lens module and the supporting bracket. The supporting plate further includes a top surface, the top surface defining a second annular groove, the second annular groove accommodating an overflow viscous colloid when fixing the lens module.

BRIEF DESCRIPTION OF THE DRAWINGS

Implementations of the present technology will now be described, by way of embodiments, with reference to the attached figures.

DETAILED DESCRIPTION

Figure 1:
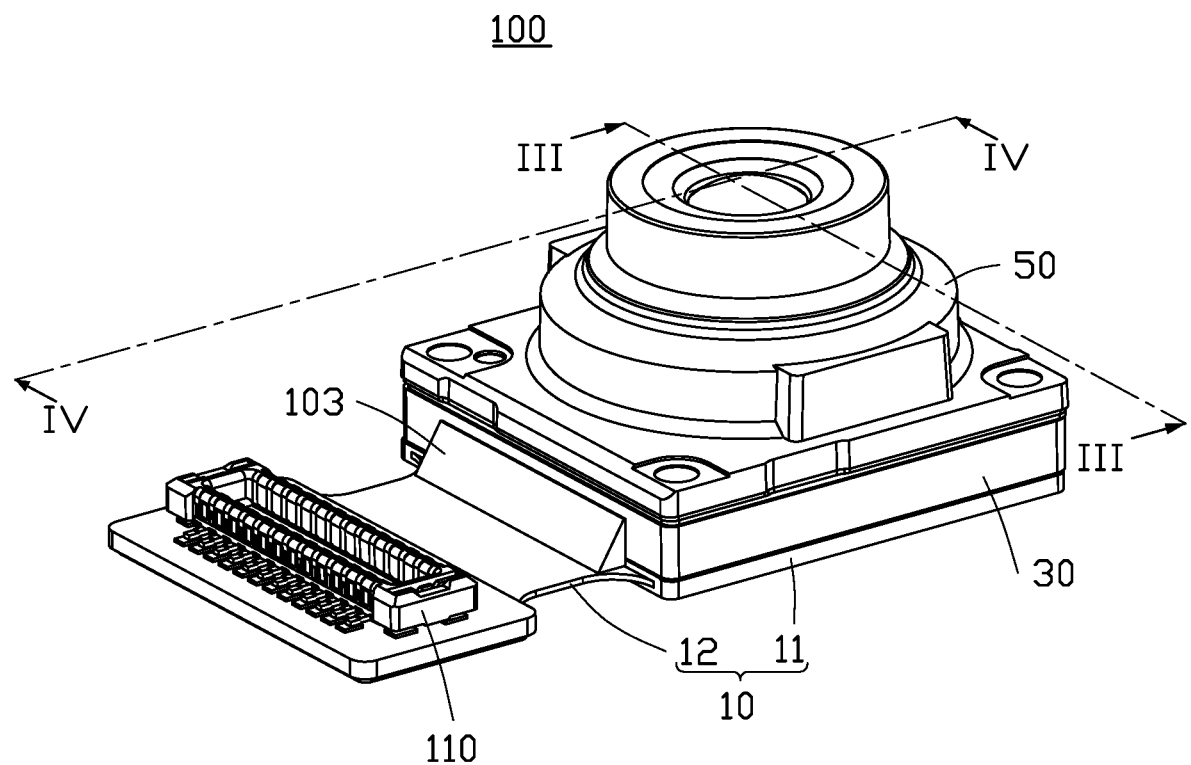
FIG. 1 is an isometric view of a camera device in accordance with one embodiment.
Figure 2:
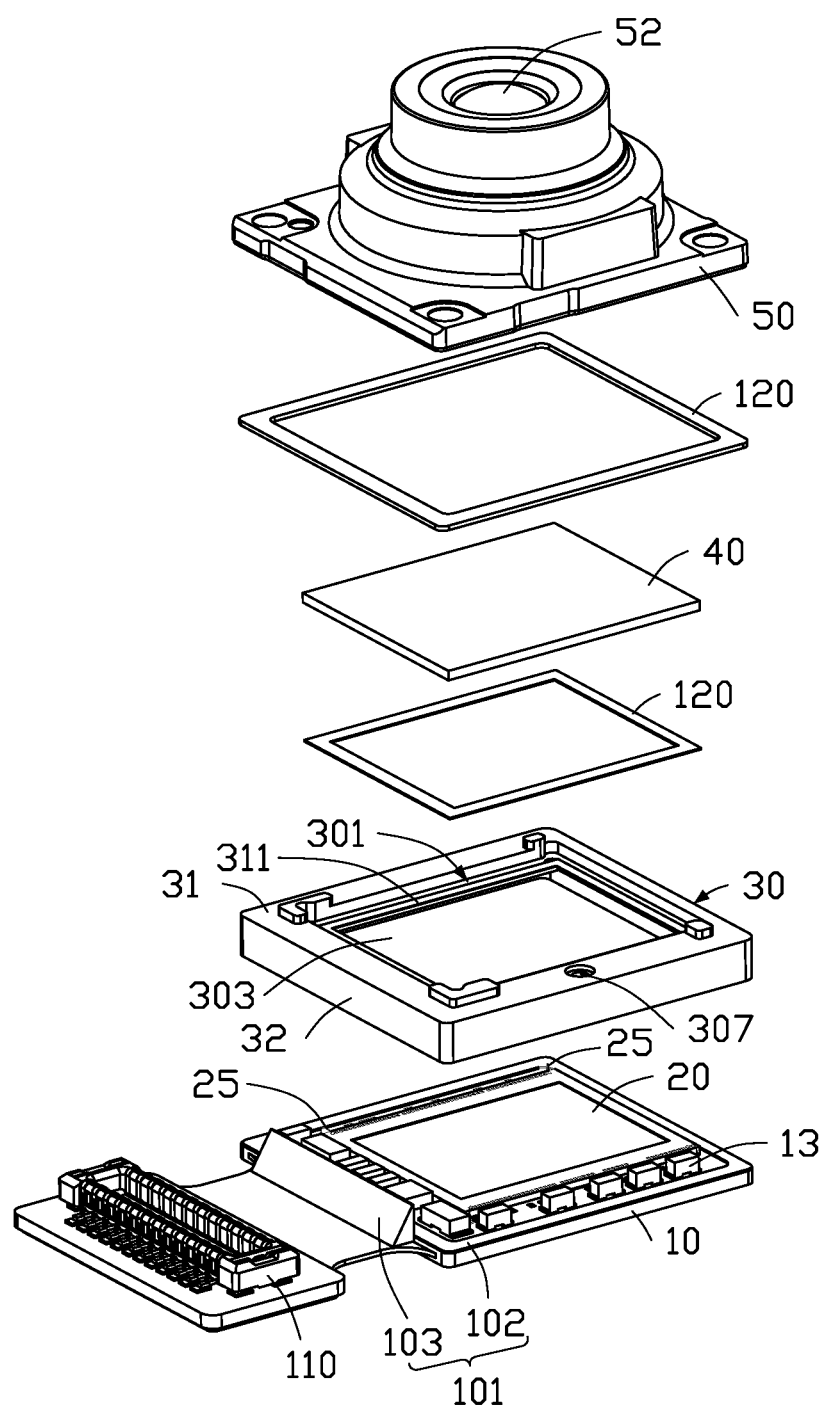
FIG. 2 is an exploded view of the camera device in FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

FIGS. 1-4 illustrate a camera device 100 according to one embodiment. The camera device 100 includes a printed circuit board 10, an image sensor 20, a supporting bracket 30, a protecting sheet 40, and a lens module 50.

The printed circuit board 10 can be a flexible circuit board, a ceramic board, or a rigid-flexible board. In the illustrated embodiment, the printed circuit board 10 is a rigid-flexible board.

The printed circuit board 10 includes a first portion 11 and a second portion 12 connected with the first portion 11. The first portion 11 is provided with circuit components 13, the second portion 12 is provided with a connector 14. In this embodiment, the circuit components 13 are mounted on an edge area of the image sensor 20 of the printed circuit board 10. The circuit components 13 are electrically connected to the image sensor 20. The circuit components 13 may be, but are not limited to, resistors, capacitors, diodes, transistors, potentiometers, relays, and drivers, etc. The connector 14 is electrically connected to the image sensor 20 for signal transmission between the image sensor 20 and an electronic device.

The image sensor 20 is mounted on a central area of the first portion 11 of the printed circuit board 10 and electrically connected to the printed circuit board 10 via wires 25. Wires 25 can be made of material selected from, but not limited to, gold, copper, aluminum, silver, etc. In particular, the wires 25 are arced or bent, thereby avoiding bending damage to the wires 25.

The supporting bracket 30 is fixed on the first portion 11 via a first adhesive 101. The first adhesive 101 includes a first adhesive portion 102 and a second adhesive portion 103. The first adhesive portion 102 is applied on the printed circuit board 10 and bonds to bottom of the supporting bracket 30. The second adhesive portion 103 is applied on the second portion 12 of the printed circuit board 10 and bonds to the supporting bracket 30. The supporting bracket 30 surrounds the image sensor 20. The supporting bracket 30 is substantially a frame and includes a supporting plate 31 and a side wall 32 perpendicular to the supporting plate 31. The supporting plate 31 and the side wall 32 together form a receiving room 305 covering the image sensor 20.

The supporting plate 31 is opened to form a step portion 301 and an aperture 303 for light transmitting. The step portion 301 includes a top bearing surface 311, and the top bearing surface 311 is a matte surface.

The top bearing surface 311 can be formed by forming a matte surface on a mold by etching the mold with an etching liquid or laser, and then injecting the material of the supporting bracket 30 using the mold with the matte surface, and the supporting bracket 30 with the matte surface can be obtained after the mold is demolded.

Figure 3:
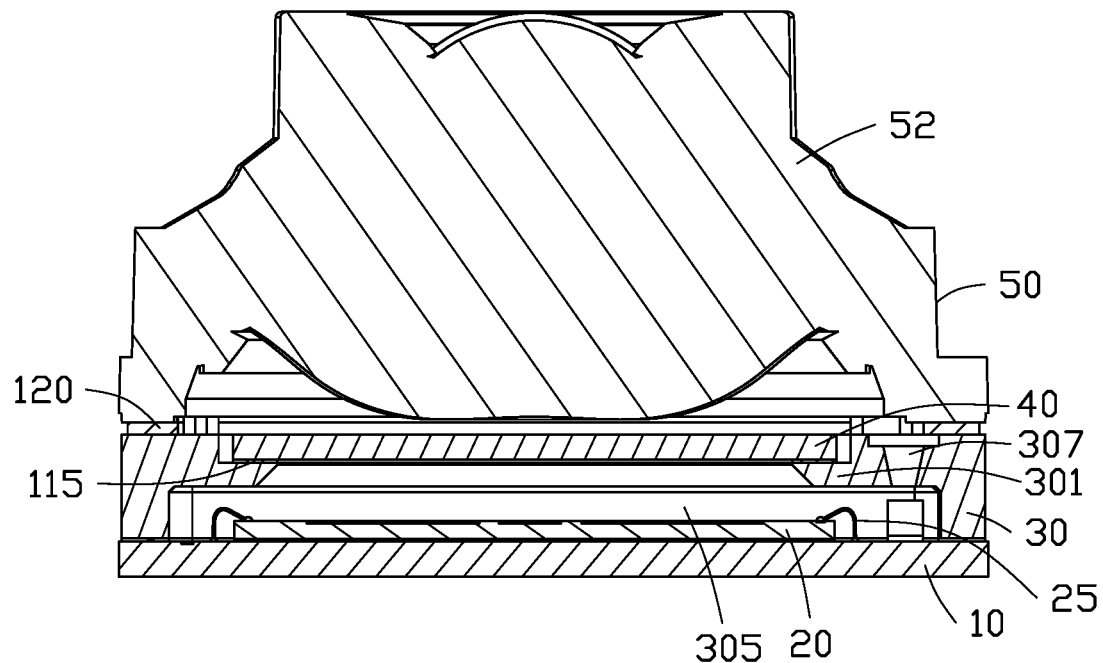
FIG. 3 is a cross-sectional view alone the line IV-IV of the camera device in FIG. 1.
Figure 4:
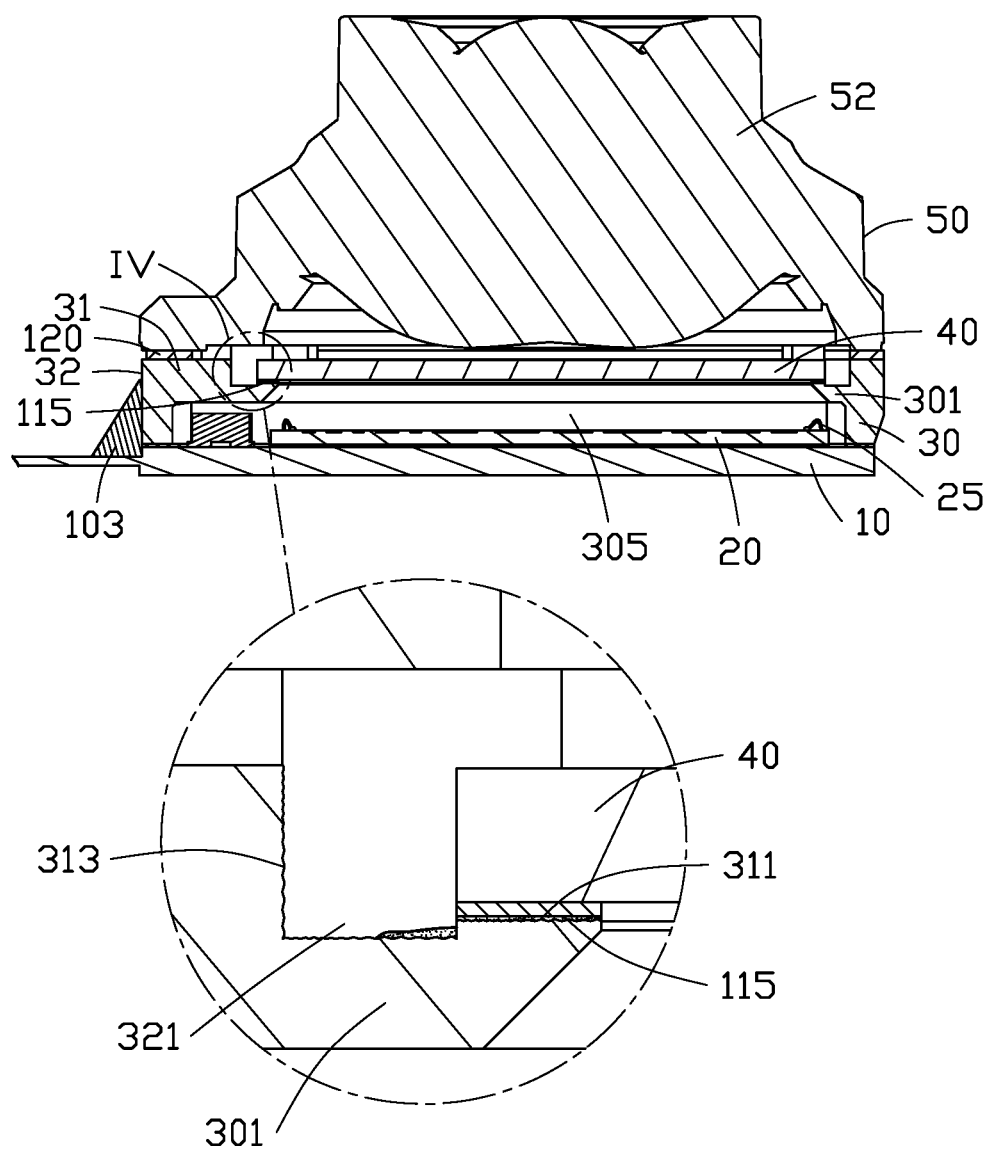
FIG. 4 is another cross-sectional view of the camera device in FIG. 1, with enlarged view of circled area IV.

The supporting bracket 30 includes a heat dissipating hole 307 defined in a periphery of the supporting plate 31, as shown in FIG. 3 and FIG. 4. The heat dissipating hole 307 communicates with the receiving room 305 and dissipates heat generated by the circuit components 13 and the image sensor 20, to avoid heat accumulating in the receiving room 305.

The protecting sheet 40 is fixed on the top bearing surface 311 of the supporting bracket 30 via a second adhesive 115. In the shown embodiment, the protecting sheet 40 is an infrared cut-off filter to filter out infrared light. In another embodiment, the protecting sheet 40 can be a color filter. The protecting sheet 40 is further configured to protect the image sensor 20, and avoid dust and fragments from falling on the image sensor 20. A first annular groove 321 (FIG. 4, Circle IV) is formed between the protecting sheet 40 and a side surface 313 of the step portion 301. The second adhesive 115 is dark in color to absorb stray light and prevent ghosting. The first annular groove 321 is configured to receive overflow of adhesive when fixing the protecting sheet 40 via the second adhesive 115.

The lens module 50 is fixed on the supporting plate 31 of the supporting bracket 30 by a viscous colloid, and the viscous colloid is solidified to form a barricade 120. The barricade 120 prevents light from leaking via a gap formed between the lens module 50 and the supporting bracket 30. The viscous colloid is black or dark color.

The lens module 50 can be a fixed-focus camera module or a zoom camera module. A fixed-focus camera module means that the focal length is not adjustable. The focal length of a zoom camera module can be adjusted, and the user can adjust the focus by adjusting its focal length when using the camera module 100. The optical lens 50 includes at least one lens 52.

The top bearing surface 311 of the supporting bracket 30 is a matte surface. When incident light falls on the top bearing surface 311 a diffuse reflection occurs. Intensity of light reflected to the image sensor 20 can thereby be significantly reduced, and light spots avoided. Thus, it is may not be necessary to apply dark glue at an edge area of the protecting sheet 40 to absorb stray light, thus saving the assembly time and cost of the camera device 100. When the second adhesive 115 is applied to fix the protecting sheet 40, an adhesive force of the second adhesive 115 with the top bearing surface 311 is increased because the top bearing surface 311 is a matte surface, and fixing of the filter glass 40 is more secure.

Figure 5:
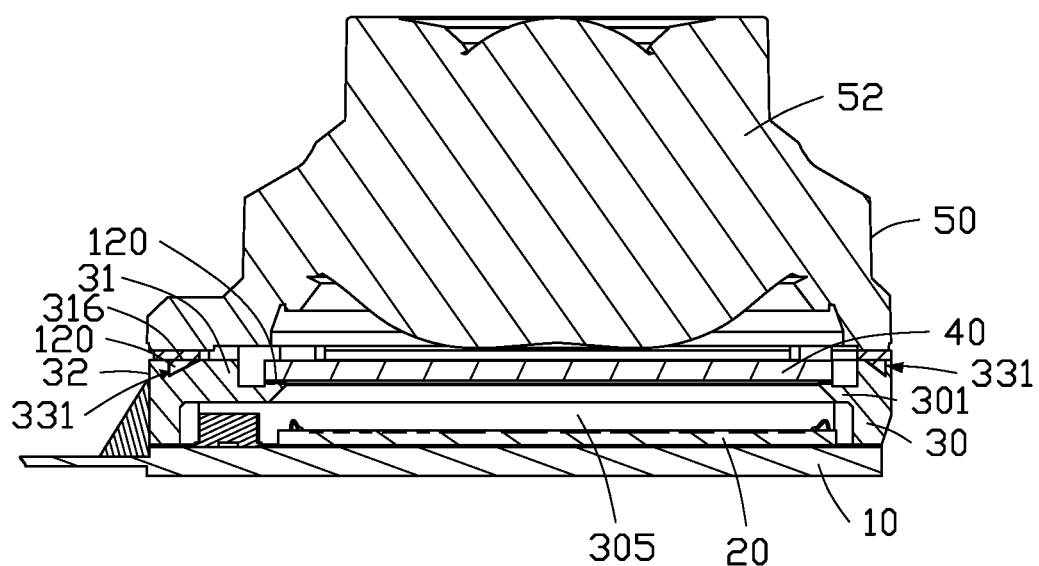
FIG. 5 is a cross-sectional view of a camera device in accordance with one embodiment.

FIG. 5 shows a camera device 200 according to another embodiment. The camera device 200 in FIG. 5 is similar to the camera device 100 in FIG. 4. The camera device 200 also includes a printed circuit board 10, an image sensor 20, a supporting bracket 30, a protecting sheet 40, and a lens module 50. The difference between the camera device 200 and the camera device 100 in FIG. 4 is that the supporting plate 31 includes a top surface 316 which has a second annular groove 331.

The second annular groove 331 accommodates overflow of viscous colloid when the viscous colloid is applied to fix the lens module 50. In this way, the viscous colloid does not flow to the protecting sheet 40 and pollute the protecting sheet 40. The second annular groove 331 is an inclined groove to facilitate the flow of a third adhesive 120 to the second annular groove 331 under gravity force. The third adhesive 120 is black or dark, to absorb stray light reflected to the second annular groove 331. In this way, the phenomenon of light exposure can also be prevented.

Figure 6:
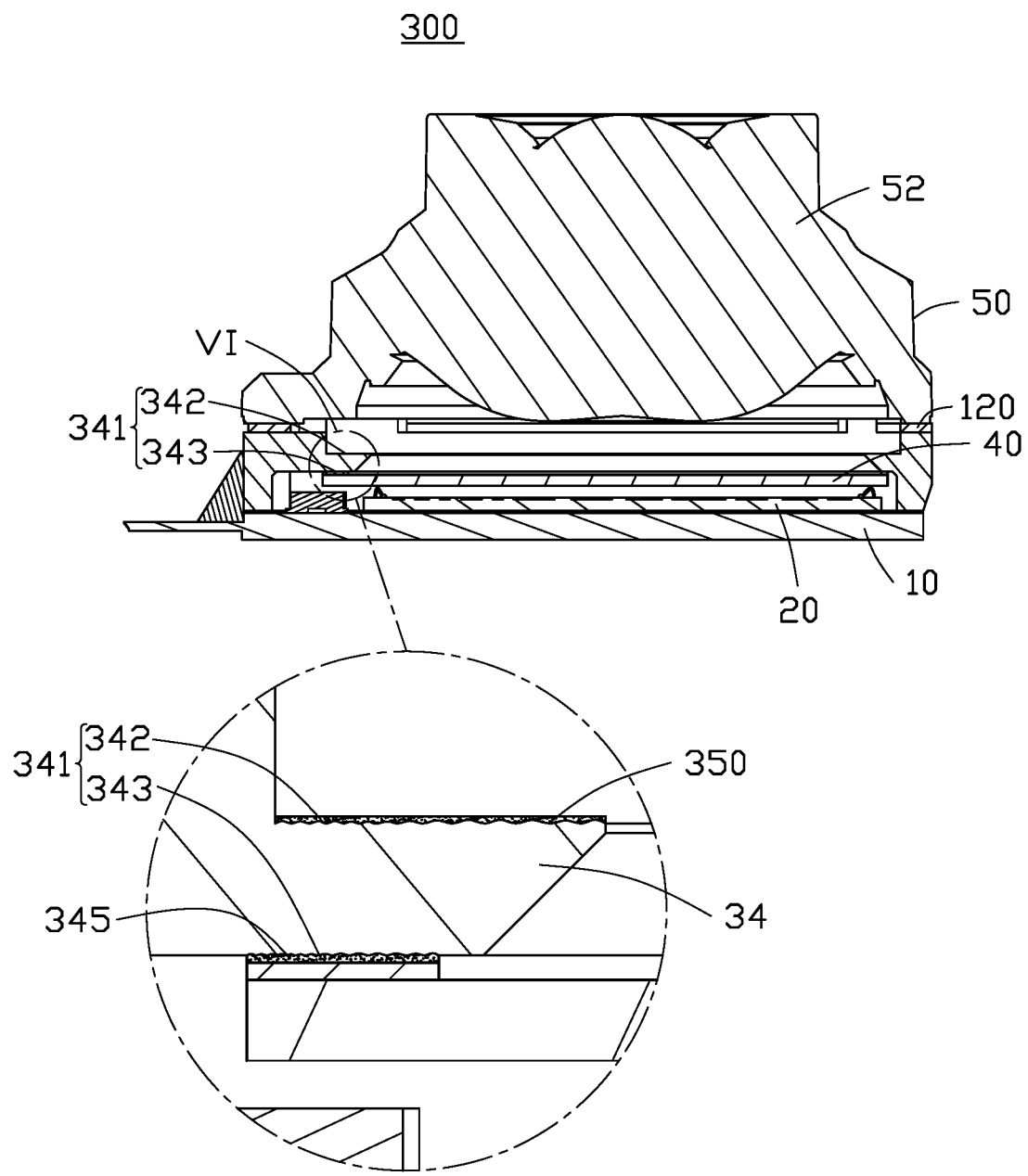
FIG. 6 is a cross-sectional view of a camera device in accordance with one embodiment, with an enlarged view of circled area VI.

FIG. 6 shows a camera device 300 according to another embodiment. The camera device 300 in FIG. 6 is similar to the camera device 100 in FIG. 4. The camera device 300 also includes a printed circuit board 10, an image sensor 20, a supporting bracket 30, a protecting sheet 40, and a lens module 50. The difference between the camera device 300 and the camera device 100 in FIG. 4 is that in the camera device 300 the step portion 341 of the supporting bracket 30 includes a top bearing surface 342 and a bottom bearing surface 343 opposite to the top bearing surface 342, and both the bottom bearing surface 343 and the top bearing surface 342 are matte surfaces. The protecting sheet 40 is fixed on the bottom bearing surface 343 via an adhesive 345, to avoid the lens module 50 being too close to the protecting sheet 40 and thus interfering with the protecting sheet 40 to cause damages to the filter glass 40 is avoid. A layer of viscous colloid 350 is formed on the top bearing surface 343. Solidification of the layer of viscous colloid 350 is not required. The layer of viscous colloid 350 is configured to attract and hold debris or dust falling from the lens module 50.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A camera device comprising:
a printed circuit board;
an image sensor mounted on the printed circuit board;
a supporting bracket fixed on the printed circuit board comprising a supporting plate and a side wall perpendicularly to the supporting plate, the supporting plate and the side wall together forming a receiving room for covering the image sensor, wherein the supporting plate is opened to form a step portion, the step portion comprises a top bearing surface with a matte surface; and a protecting sheet fixed on the top bearing surface; and
a lens module fixed on the supporting bracket by a viscous colloid, the viscous colloid being solidified to form a barricade, the barricade preventing light from leaking via a gap between the lens module and the supporting bracket;

wherein the supporting plate further comprises a top surface, the top surface defining a second annular groove, the second annular groove accommodating an overflow viscous colloid when fixing the lens module.

2. The camera device of claim 1, wherein the protecting sheet is spaced apart with side surface of the step portion.

3. The camera device of claim 1, wherein the protecting sheet is an infrared cut-off filter or a color filter.

4. The camera device of claim 1, the supporting bracket further comprises a heat dissipating hole at the periphery of the supporting plate, the heat dissipating hole communicates with the receiving room.

5. The camera device of claim 1, wherein the side surface of the step portion is a matte surface.

6. The camera device of claim 1, wherein the viscous colloid is black or dark color.

7. The camera device of claim 1, wherein the printed circuit board is a rigid-flexible board and comprises a first portion and a second portion connected with the first portion, the image sensor and the supporting bracket being fixed on the first portion.

8. The camera device of claim 2, wherein the protecting sheet is fixed on the top bearing surface by an adhesive, the protecting sheet and side surface of the step portion together form a first annular groove, the first annular groove receives an overflow adhesive when fixing the protecting sheet.

9. The camera device of claim 7, wherein:
the supporting bracket is fixed on the first portion of the printed circuit board by a first adhesive, the first adhesive comprises a first adhesive portion and a second adhesive portion, the first adhesive portion is applied on the printed circuit board and configured to fix bottom of the supporting bracket, the second adhesive portion is applied on the second portion of the printed circuit board and configured to fix one side surface of the supporting bracket.

10. A camera device comprising:
a printed circuit board;
an image sensor mounted on the printed circuit board;
a supporting bracket fixed on the printed circuit board comprising a supporting plate and a side wall perpendicularly to the supporting plate, the supporting plate and the side wall together forming a receiving room for covering the image sensor, wherein the supporting plate is opened to form a step portion, the step portion comprises a top bearing surface with a matte surface, and a bottom bearing surface opposite to the top bearing surface, and the bottom bearing surface is matte surface;
an adhesive formed on the bottom bearing surface;
a protecting sheet is fixed on the bottom bearing surface; and
a lens module fixed on the supporting bracket by a viscous colloid, and the viscous colloid is solidified to form a barricade, the barricade prevents light from leaking via a gap formed between the lens module and the supporting bracket;
wherein the supporting plate comprises a top surface, the top surface defining a second annular groove, the second annular groove being configured to receive portion of the viscous colloid.

11. The camera device of claim 10, wherein:
a layer of viscous colloid is formed on the top bearing surface.

12. The camera device of claim 11, wherein the viscous colloid is black or dark color.

\* \* \* \* \*